(12) United States Patent
Kim

(10) Patent No.: US 6,710,547 B2
(45) Date of Patent: Mar. 23, 2004

(54) ORGANIC EL DISPLAY DEVICE

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/191,408

(22) Filed: Jul. 10, 2002

(65) Prior Publication Data

US 2003/0011318 A1 Jan. 16, 2003

(30) Foreign Application Priority Data

Jul. 12, 2001 (KR) ........................................ 2001-41891

(51) Int. Cl.$^7$ ................................................. G09G 3/10
(52) U.S. Cl. ............................... 315/169.1; 315/169.3; 345/76
(58) Field of Search .......................... 315/169.1, 169.3; 313/504, 506, 507, 111; 257/643; 385/31, 123; 381/131; 345/76–78

(56) References Cited

U.S. PATENT DOCUMENTS

| | | | |
|---|---|---|---|
| 4,985,663 A | * | 1/1991 | Nakatani ................. 315/169.3 |
| 6,177,767 B1 | * | 1/2001 | Asai et al. ................ 315/169.1 |
| 6,259,838 B1 | * | 7/2001 | Singh et al. .................. 385/31 |
| 6,259,846 B1 | * | 7/2001 | Roach et al. ................ 385/123 |
| 6,555,969 B2 | * | 4/2003 | Yamazaki ................ 315/169.3 |
| 2003/0146710 A1 | * | 8/2003 | Nakanishi ................ 315/169.3 |

* cited by examiner

Primary Examiner—Don Wong
Assistant Examiner—Jimmy T. Vu
(74) Attorney, Agent, or Firm—Fleshner & Kim, LLP

(57) ABSTRACT

An organic EL display device is disclosed, which is fabricated in a tape automated bonding (TAB) method. The organic EL display device includes a driving part; a display panel including a substrate, a plurality of first and second electrodes formed on the substrate in a matrix type; and first and second lines having different lengths for being alternately arranged, and respectively applying signals from the driving part to the first and second electrodes; and a connecting part including a third line for electrically connecting the first and second lines to the driving part.

12 Claims, 3 Drawing Sheets

ORGANIC EL DISPLAY DEVICE

This application claims the benefit of the Korean Application No. 2001-0041891 filed on Jul. 12, 2001, which is hereby incorporated by reference.

BACKGROUND OF THE INVENTION

1. Field of the Invention

The present invention relates to a display device, and more particularly, to an organic EL display device by a tape automated bonding (TAB) method.

2. Discussion of the Related Art

FIG. 1 is a plan view showing an organic EL display panel to which a related art film type device is attached.

As shown in FIG. 1, the organic EL display panel includes a first electrode 2, a second electrode 4, a connecting part 4-1 of the second electrode, a barrier 6 and an organic EL layer 3.

The strip type electrode is formed by chemically etching on a transparent substrate 1, and the second electrode 4 is formed in perpendicular to the first electrode 2. At this time, the connecting part 4-1 of the second electrode is used to easily form second electrode patterns, and the barrier is formed to electrically disconnect the second electrode patterns with one another. After that, the organic EL layer 3 is deposited on the barrier 6 by a vacuum deposition method.

Referring to FIG. 1, the first electrode 2 is formed in perpendicular to the second electrode 4. In this respect, the related art organic EL display panel includes a film type device 5 (COF, FPC, TCP, etc.) having a line 5-1 for connecting the display panel to a driving chip (not shown), and two TAB regions for connecting the display panel to the first and second electrodes.

That is, the two film type devices 5 such as FPC, TCP and COF are required to mount the line on the PCB, and the TAB process steps are performed two times.

Accordingly, manufacturing cost is increased in that the two FPCs (or TCPs) are used and the TAB process steps are performed two times, so that competitive power of the organic EL display panel is weakened due to high manufacturing cost.

SUMMARY OF THE INVENTION

Accordingly, the present invention is directed to an organic EL display panel that substantially obviates one or more problems due to limitations and disadvantages of the related art.

An object of the present invention is to provide an organic EL display panel, in which a TAB region of a film type device is formed at a minimum size to decrease manufacturing cost of the module, and electrode lines having different lengths are alternately formed in the TAB region to increase a contact region of the electrode lines to connectors in a case of that the pitch of the electrode lines become narrow with high resolution of the organic EL display device, so that it is possible to stably connect the electrode lines to the film type device through the connectors even though an error range for aligning is wide.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL display panel according to the present invention includes a driving part; a display panel including a substrate, a plurality of first and second electrodes formed on the substrate in a matrix type, and first and second lines having different lengths for being alternately arranged, and respectively applying signals from the driving part to the first and second electrodes; and a connecting part including a third line for electrically connecting the first and second lines to the driving part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

An organic EL display panel according to the present invention will be explained with reference to the accompanying drawings.

Figure 1:
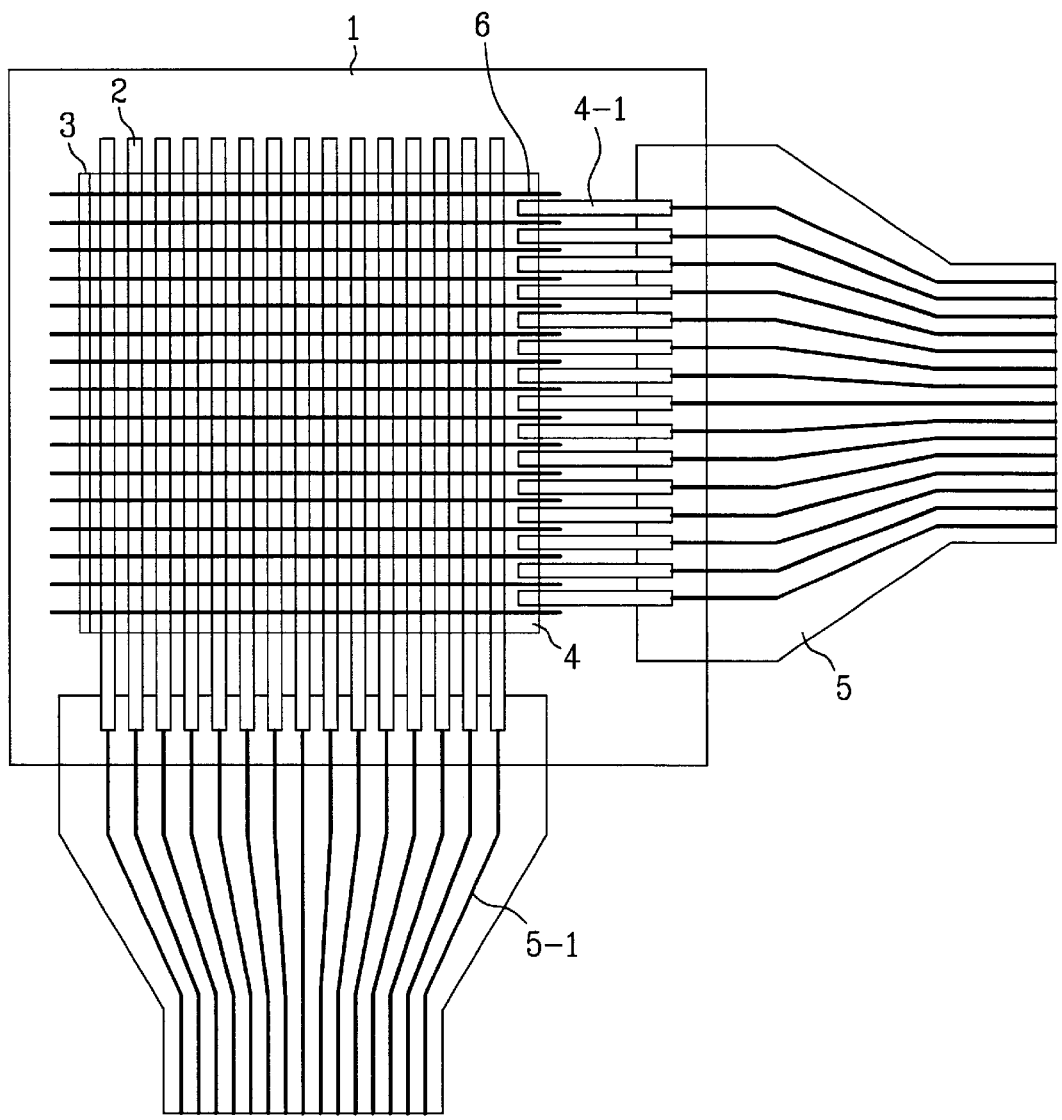
FIG. 1 is a plan view showing an organic EL display panel to which a related art film type device is attached.
Figure 2:
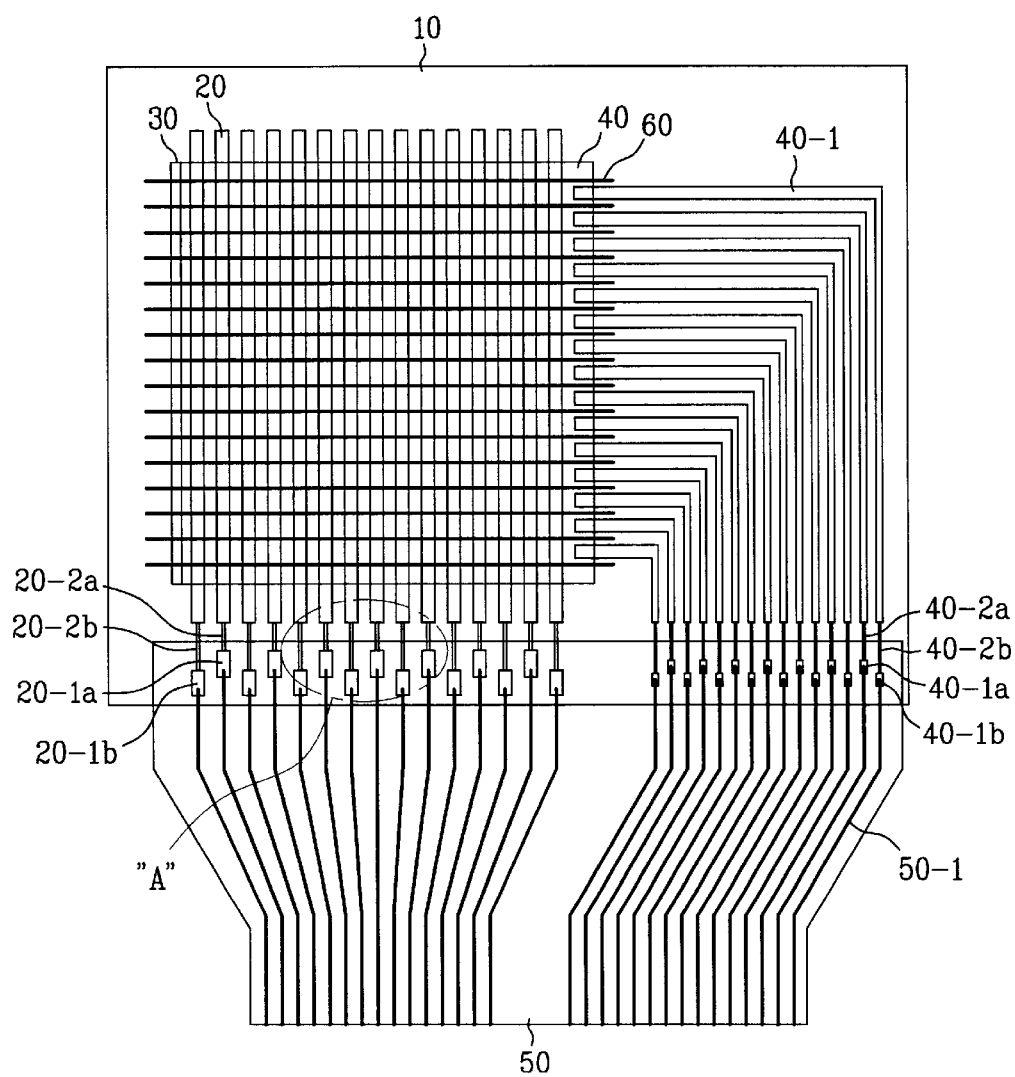
FIG. 2 is a plan view showing an organic EL display panel to which a film type device according to the present invention is attached.

FIG. 2 is a plan view showing an organic EL display panel to which a film type device according to the present invention is attached.

As shown in FIG. 2, the organic EL display panel includes a transparent substrate 10, an organic EL layer 30, a connecting part 40-1 of a second electrode, a barrier 60, first electrode lines 20-2a, 20-2b and second electrode lines 40-2a, 40-2b.

At this time, the organic EL layer 30 is formed in a plurality of pixels defined by crossing a plurality of first and second electrodes 20, 40 to one another. Then, the connecting part 40-1 of the second electrode is used for easily forming second electrode patterns, and the barrier 60 is formed to electrically disconnect the second electrodes patterns 40 with one another. Also, the first electrode lines 20-2a, 20-2b having different lengths from each other are alternately formed on the transparent substrate 10 for being connected with a first electrode 20. The second electrode lines 40-2a, 40-2b having different lengths from each other are alternately formed on the transparent substrate 10 for being connected with the second electrode 40 through the connecting part 40-1 of the second electrode.

The organic EL display panel further includes first connectors 20-1a, 20-1b connected with the first electrode lines 20-2a, 20-2b, and second connectors 40-1a, 40-1b connected with the second electrode lines 40-2a, 40-2b.

The first and second electrode lines 20-2a, 20-2b and 40-2a, 40-2b may be formed with transparent electrodes, and supplementary electrodes of metal material for improving conductivity. In another way, the first and second electrode lines may be formed only with the supplementary electrodes.

The first and second connectors 20-1a, 20-1b and 40-2a, 40-2b are formed with transparent electrodes, and supplementary electrode of metal material for improving conductivity. In another way, the first and second connectors may be formed only with the transparent electrodes.

The first and second electrode lines 20-2a, 20-2b and 40-2a, 40-2b are arranged in one direction. Then, a film type device 50 (COF, FPC, TCP, etc.) having a line 50-1 of the same pitch with the first and second electrode lines 20-2a, 20-2b and 40-2a, 40-2b is attached to the display panel by a first TAB method.

The pitch and shape of the line 50-1 of the device 50 (FPC, TCP, COF, etc.) is same with that of the first and second electrode lines 20-2a, 20-2b and 40-2a, 40-2b.

The first and second electrode lines 20-2a, 20-2b and 40-2a, 40-2b are contacted to the line 50-1 of the device 50 by the first TAB method, and the line 50-1 is connected to a driving part (not shown) for driving the organic EL display panel.

Figure 3:
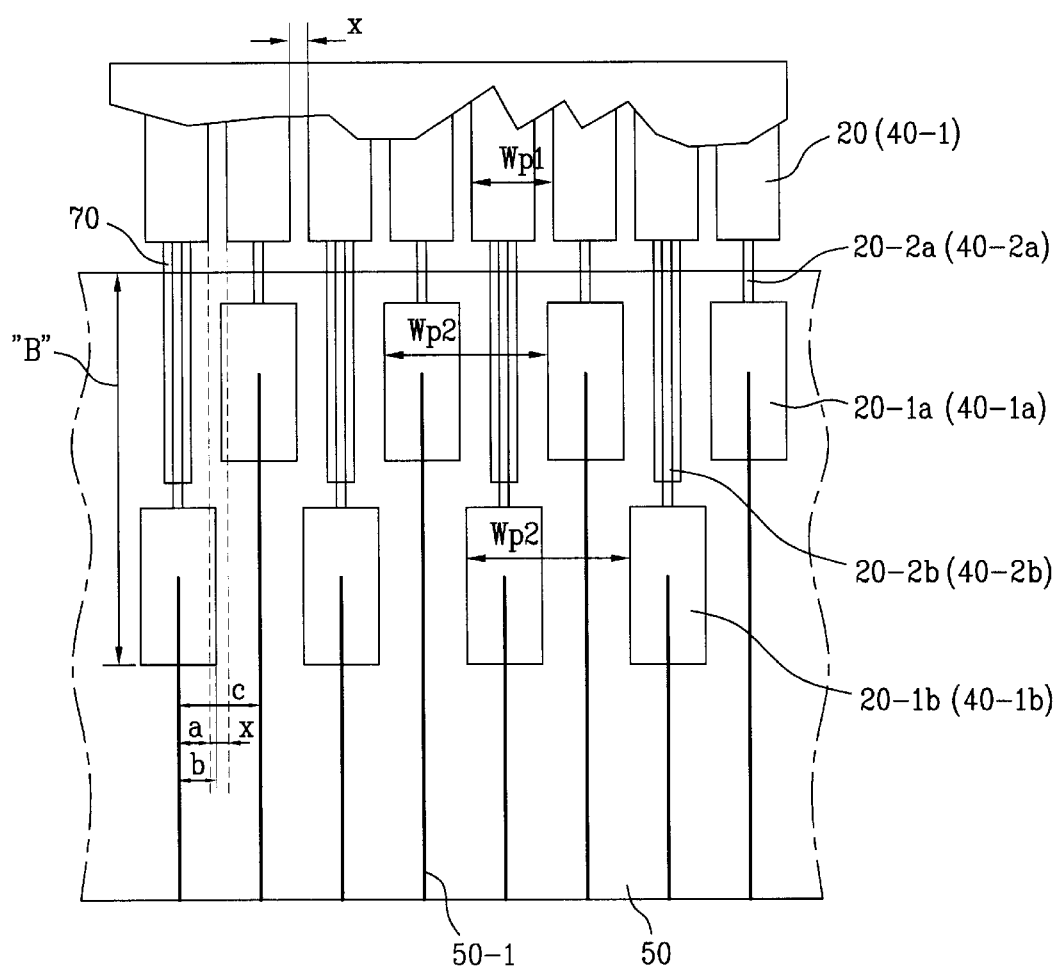
FIG. 3 is a detailed view showing "A" portion of FIG. 2.

FIG. 3 is a detailed view showing "A" portion of FIG. 2.

Referring to FIG. 3, long electrode lines 20-2b, 40-2b and short electrode lines 20-2a, 40-2a are alternately formed in a TAB region B of the organic EL display panel. At this time, the long electrode lines 20-2b, 40-2b formed between the short electrode lines are positioned at a lower part than the short electrode lines.

In this structure, the pitch Wp2 between the long electrode lines 20-2b, 40-2b and between the short electrode lines 20-2a, 40-2a is twice as high as the pitch "Wp1" between the electrodes of the display panel.

In the TAB region B, wide connectors 20-1a, 20-1b are formed at ends of the electrode lines 20-2a, 20-2b and 40-2a, 40-2b for easily connecting the line of the device to the electrode lines through the connectors.

Referring to FIG. 3, there is limitation in forming the pitch between the electrodes 20, 40 below the minimum pitch range.

Accordingly, the first and second electrodes 20, 40 are directly connected with the line 50-1 of the film type device 50 for driving the display panel by connecting the scan line (first electrode line) to the data line (second electrode line). At this time, an error range for aligning is narrow, so that the first and second electrode lines could be misaligned with the line 50-1 of the device 50.

However, if the electrode lines 20-2a, 20-2b and 40-2a, 40-2b having different lengths are alternately arranged, it is possible to increase the width of the connectors 20-1a, 20-1b and 40-1a, 40-1b connected to the electrode lines at a predetermined range, so that the line of the device can be contacted to the connectors within a narrow error range.

For example, if the line 50-1 of the related art device 50 is not within the range of "a" at both sides of the center in the connectors of the first electrode lines 20-2a, 20-2b, the line 50-1 of the device is not contacted to the first electrode 20.

However, in the present invention, the error range of the line 50-1 of the device 50 is varied according to the width of the connector 20-1a, 20-1b. That is, if the line 50-1 of the device 50 is within the range of "b" at both sides of the center in the connectors of the first electrode lines 20-2a, 20-2b, the line 50-1 of the device 50 is contacted to the first electrode 20.

The first electrode lines 20-2a, 20-2b having long and short lengths are alternately formed in the TAB region B of the display panel according to the present invention. In this respect, "2b" which is the width of the first connector 20-1a, 20-1b is wider than "2a" at a range of "x", which is the width between the first electrodes, to electrically connect the line 50-1 to the first electrode lines 20-2a, 20-2b.

If the width is increased at the range of "x", it is possible to stably perform the TAB process step even though the error range for aligning is wide.

Also, an insulating layer 70 is formed on the long first electrode line 20-2b between the short first electrode lines 20-2a, so that the long first electrode line 20-2b is insulated from the first connector 20-1a during the TAB process step of the device 50.

Even though the width of the first connector 20-1a connected to the first electrode line 20-2a is enlarged, the first electrode line 20-2b is insulated from the connector 20-1a in that the insulating layer 70 is formed on the first electrode line 20-2b.

At this time, the insulating layer 70 is formed of inorganic material such as oxide $SiO_2$ and nitride $SiNx$, or organic material such as polyimide (especially, polyacryl, novolac, polyphenyl and polystyrene). Also, the insulating layer 70 is formed at a thickness of 0.01 $\mu$m to 10 $\mu$m.

The structure of the second electrode lines 40-2a, 40-2b and the second connectors 40-1a, 40-1b is same with that of FIG. 3, so that the explanation for the structure will be omitted.

The organic EL display panel is used for a display device having a film type device such as COF, TCP and FPC. At this time, the film type device has a driving chip connected to scan and data lines for driving the display panel.

The display device having the film type device such as COF, TCP and FPC includes the display panel, COF, a plurality of data and scan lines, and a plurality of connecting lines.

In the display panel, two first electrode lines having different lengths are alternately formed on the transparent substrate, and are connected to the first electrode. Also, two second electrode lines having different lengths are alternately formed in the display panel for being connected with the second electrode. Then, the COF includes a chip part at which the chip is positioned, and a connecting part at which the display panel is positioned. The plurality of data and scan lines are connected to the COF from the first and second electrode lines of the display panel. Subsequently, the plurality of connecting lines are formed in the connecting part to electrically connect the scan and data lines to the COF, respectively.

As explained above, the organic EL display panel according to the present invention has the following advantages.

With high resolution of the organic EL display panel, the pitch of the electrode line has been decreased. At this time, if the electrode lines having different lengths are alternately formed, it is possible to increase the width of the connector for connecting the electrode line to the line of the device such as COF, FPC and TCP by the TAB method. That is, even though the error range for aligning is wide, the electrode line is stably connected to the line of the device through the connector, so that the reliability of the display panel is obtained, and the yield is improved.

Also, it is possible to form the TAB regions at a minimum, so that the cost of the module is decreased in the manufacturing process steps.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescent (EL) device, comprising:
    at least one organic EL layer;
    first electrodes and second electrodes formed in a matrix type by crossing with each other; and
    an electrical line connector configured to connect the first electrodes and the second electrodes with a driving unit, wherein the electrical line connector comprises,
    first electrode lines connected with the first electrodes for having a predetermined pitch,
    connecting lines connected with the second electrodes in the direction of the second electrodes, and
    second electrode lines connected with the connecting lines, wherein the connecting lines connect with the second electrodes in the direction of the first electrodes.

2. The device of claim 1, wherein said device further comprising:
    connectors formed between the first electrode lines and the driving unit, and between the second electrode lines and the driving unit.

3. The device of claim 2, wherein the first electrode lines have different line size with each other and the second electrode lines have different line size with each other, thereby the connectors are formed in zigzag.

4. The device of claim 2, wherein a line width of said connectors is larger than that of the first electrode lines and the second electrode lines.

5. The device of claim 2, wherein a line width of said connectors is larger than that of the first electrodes.

6. The device of claim 2, wherein the connectors are connected with the driving unit through electrical lines.

7. The device of claim 1, wherein the first electrode lines and the second electrode lines have a smaller width than lines of the first electrodes and the second electrodes.

8. The device of claim 1, wherein the electrical line connector is a film type device that can wire electrical lines, and connects the organic EL device by a tape automated bonding (TAB) method.

9. The device of claim 8, wherein said device further comprising:
    connectors formed between the first electrode lines and the driving unit, and between the second electrode lines and the driving unit.

10. The device of claim 9, wherein the film type device connects in a single area where the connectors are positioned by the TAB method.

11. The device of claim 1, wherein the connecting lines and the second electrode lines have a first predetermined pitch in the direction of the first electrodes, and wherein the first electrode lines connect with the first electrodes in the direction of the first electrodes.

12. The device of claim 11, wherein the predetermined pitch is equal to the first predetermined pitch.

* * * * *